United States Patent [19]
Baker

[11] 3,971,976
[45] July 27, 1976

[54] ELECTRIC POWER SUPPLY
[75] Inventor: Richard H. Baker, Bedford, Mass.
[73] Assignee: Massachusetts Institute of Technology, Cambridge, Mass.
[22] Filed: Feb. 10, 1975
[21] Appl. No.: 548,480

[52] U.S. Cl. .................................. 321/4; 307/38; 321/15; 321/65; 335/49
[51] Int. Cl.² .......................................... H02M 5/45
[58] Field of Search ............. 200/188, 189; 307/11, 307/13, 17, 19, 24, 82, 112, 117, 118, 132 E, 143, 38; 321/2, 4, 6, 15, 27 R, 47, 61, 65, 66; 335/49, 50

[56] References Cited
UNITED STATES PATENTS

| | | | |
|---|---|---|---|
| 1,717,070 | 6/1929 | Siegmund | 321/15 |
| 2,802,918 | 8/1957 | Boyle | 335/49 X |
| 3,363,165 | 1/1968 | Wilkinson | 321/27 R |
| 3,748,492 | 7/1973 | Baker | 307/117 |
| 3,818,307 | 6/1974 | Hamilton et al. | 321/27 R |

Primary Examiner—A. D. Pellinen
Attorney, Agent, or Firm—Arthur A. Smith, Jr.; Robert Shaw; Martin M. Santa

[57] ABSTRACT

An electric power supply wherein electric energy is processed using high frequency techniques to provide as output electric energy whose frequency and/or voltage are programmable. The apparatus described can, for example, accept as input low frequency energy (e.g., 60 Hz) at available voltages (e.g., 120/240/480) and can process the same through intermediate high frequency steps to provide an output at power levels and voltages found in industrial power circuits, that can be varied both in frequency and voltage; or the input can be processed in like manner to give, for example, a very high voltage pulsed output.

31 Claims, 9 Drawing Figures

ELECTRIC POWER SUPPLY

The present invention relates to solid-state frequency changers for use in electrical power systems.

Attention is called to the following U.S. Pat. and applications therefor: U.S. Pat. No. 3,748,492 (Baker); U.S. Pat. No. 3,866,060 (Bannister et al); U.S. Pat. No. 3,867,643 (Baker et al); U.S. Pat. No. 3,899,689 (Baker); Ser. No. 508,293, filed Sept. 23, 1974 (Bannister et al); Ser. No. 515,284, filed Oct. 16, 1974 (Baker); U.S. Pat. No. 3,909,685 (Baker et al). An application for Letters Patent that accompanies herewith, Ser. No. 548,493, filed Feb. 10, 1975, is hereby incorporated herein by reference: "Variable Speed Electronic Motor and the Like" (Baker).

Apparatus to produce high power sinusoidal waveforms at frequencies other than 60 Hz are necessary for variable speed electrical drive systems, for example. Frequency changers are usually built in one of three basic ways: (1) a variable speed motor/generator set, (2) a solid-state AC to AC converter wherein standard 60 Hz AC power is first rectified to form DC and then chopped at a variable rate to directly generate AC at the new frequency, and (3) cyclo-converters which use pulse-width modulation techniques to generate power at a new frequency by gating selected segments of the incoming 60 Hz waveform. Because the motor/generator is bulky and requires high maintenance, the second and third methods using non-rotating, solid-state techniques are becoming dominant.

The second method (AC to DC to AC) works well for those uses that require high output frequencies, but the output transformer becomes prohibitively large for low frequency generation. Also, where the output of a chopper is a low frequency square wave, substantial output filtering is required.

There are two general types of cycloconverters: (a) line-commutated cycloconverters which convert to an output frequency lower than the input frequency and use line commutation; and (b) self-commutated cycloconverters which convert the input frequency to an output frequency higher than the input frequency and use load or forced commutation. Unfortunately, up to now, it has proved difficult to combine the two types to obtain frequency control both above and below the input frequency in one unit.

An important advantage of cycloconverters is that they convert directly from AC to AC without an intermediate DC stage. This does save components but, because the system uses repetitive fast-narrow pulses, the waveforms are rich in harmonics and therefore often require heavy filtering. Operating in a high power, fast-pulse mode also places stringent requirements on components, increasing the susceptibility to unpredictable catastrophic failure.

A new method for changing the frequency of high power waveforms has been evolved, as hereinafter discussed, using switched source synthesizing techniques. This method has the advantages that the system can produce an output frequency above as well as below the frequency of the input waveform. The system also produces sinusoidal waveforms that are low in harmonic distortion, yet uses high frequency techniques that require a minimum of filtering.

Accordingly, it is an object of the present invention to provide electric energy at kilowatt power levels in the form of quasi-sinusoidal waveforms whose frequency and/or voltage can be varied.

Another object is to provide apparatus operable to supply such electric energy, which apparatus employs a minimal number and size of parts.

A further technical area addressed by this invention is that of very high voltage power supplies such as may be used in scientific and industrial instrumentation, for example, x-ray devices, electric precipitators and like systems. Power supplies proposed for such systems usually start with low voltage power and use either a single large step-up transformer, with insulation, size and weight problems, or a diode multiplier stack that has low efficiency and slow response time. In some of the above-mentioned patents and patent applications, there is described a new concept for combining individual supply voltage means to furnish a modular structure for such purposes; the invention herein disclosed represents a novel extension of the prior work.

Hence, a further object of this invention is to provide a novel high voltage power supply.

These and still further objects are discussed in the description that follows and are delineated in the appended claims.

The foregoing objects are achieved by a processor that receives or generates high frequency electric energy and processes the same to give, as output, electric energy whose frequency is much lower than the input or the generated frequency and whose voltage and/or power level can differ from that of the processor input — up or down — at any instant in time. The processor can deliver energy to a load at power frequencies from a zero to, say, 400 Hz (or even to 1,000 Hz) — although it is capable of higher frequencies — and at standard power voltages (e.g., 120/240/480 volts), 80 in one aspect very high voltages of the order of 80 to 100 kilovolts pulse power is provided as an output. In a typical situation what is done is to operate upon a 60 Hz input in such a manner as to give an output whose characteristics differ drastically from the input. The processor employs transformers which, because of the high frequency processing technique, can be small for the amount of energy delivered and it employs, also, in the preferred form, capacitances (as supply voltage means) which also can be small and for the same reason. In its preferred form the capacitances are interconnected in a programmed fashion to supply the required output demanded by a load.

The invention is hereinafter described with reference to the accompanying drawing in which.

Before going into a detailed discussion of the invention, some preliminary remarks may be helpful in the interest of cohesion. It should be apparent that the invention is aimed at two fields of use: the first field is that of low voltage (120/240/480 volts, usually), low frequency (up to about 400 cycles, usually), industrial uses and the second field is that of high voltage ranging up to 80,000 to 100,000 volts, and above. By way of illustration, the first field would include that of variable-speed electric motors in fractional and integral horsepower sizes whereas the second would include medical x-ray power supplies. The common subject matter here is the use of high frequency techniques to process electric energy between the input to the electric power supply and the output from the supply. As the discussion proceeds, it will be seen that such high frequency techniques serve, in the systems discussed, to optimize the magnetic characteristics of those circuit elements whose magnetic properties predominate and the electrical characteristics of those circuit elements whose electrical properties predominate, while minimizing the deficiencies of each type element. It is appreciated that the terms "high frequency" and "low frequency" are relative terms and mean different things in different fields of technology. In this specification, high frequency refers to frequencies $\geq$ 400 Hz (typically $\sim$ 1,000 Hz) and low frequency refers to frequencies $\leq$ 400 Hz — although what is done here is to point out, in a general way, that electric energy at industrial power levels can be processed with unusual technical benefits in a system in which, at some intermediate step in the processing, the energy is cyclic in form and at a frequency greater than 60 Hz.

Figure 1:
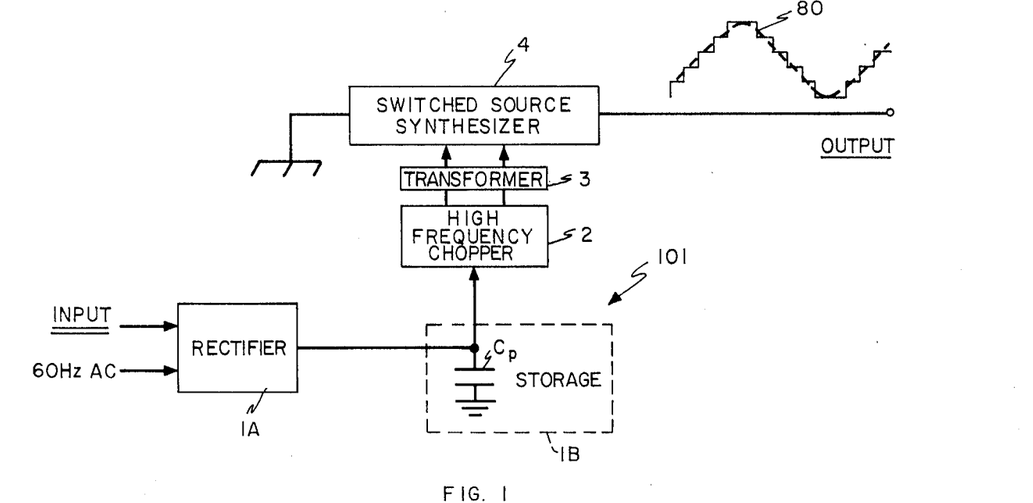
FIG. 1 is a schematic electrical circuit diagram in block diagram form, showing a system employing the present inventive concept whereby 60 Hz input is processed using high frequency techniques to give a variable frequency, variable voltage output.

Apparatus directed to the first field of use is discussed first and then the second use is taken up. Typically, the systems described accept 60 Hz power and in both situations the output is usually not 60 Hz: hence the apparatus performs frequency changing functions. The frequency changing aspect, however, shows most clearly in the first instance, and, indeed, the apparatus marked 101 in FIG. 1 is called a frequency changer for that reason. The system depicted in FIG. 1 is single phase; a 60 Hz input is received and processed to deliver a quasi-sinusoidal output 80 to a load, as now explained.

Figure 2:
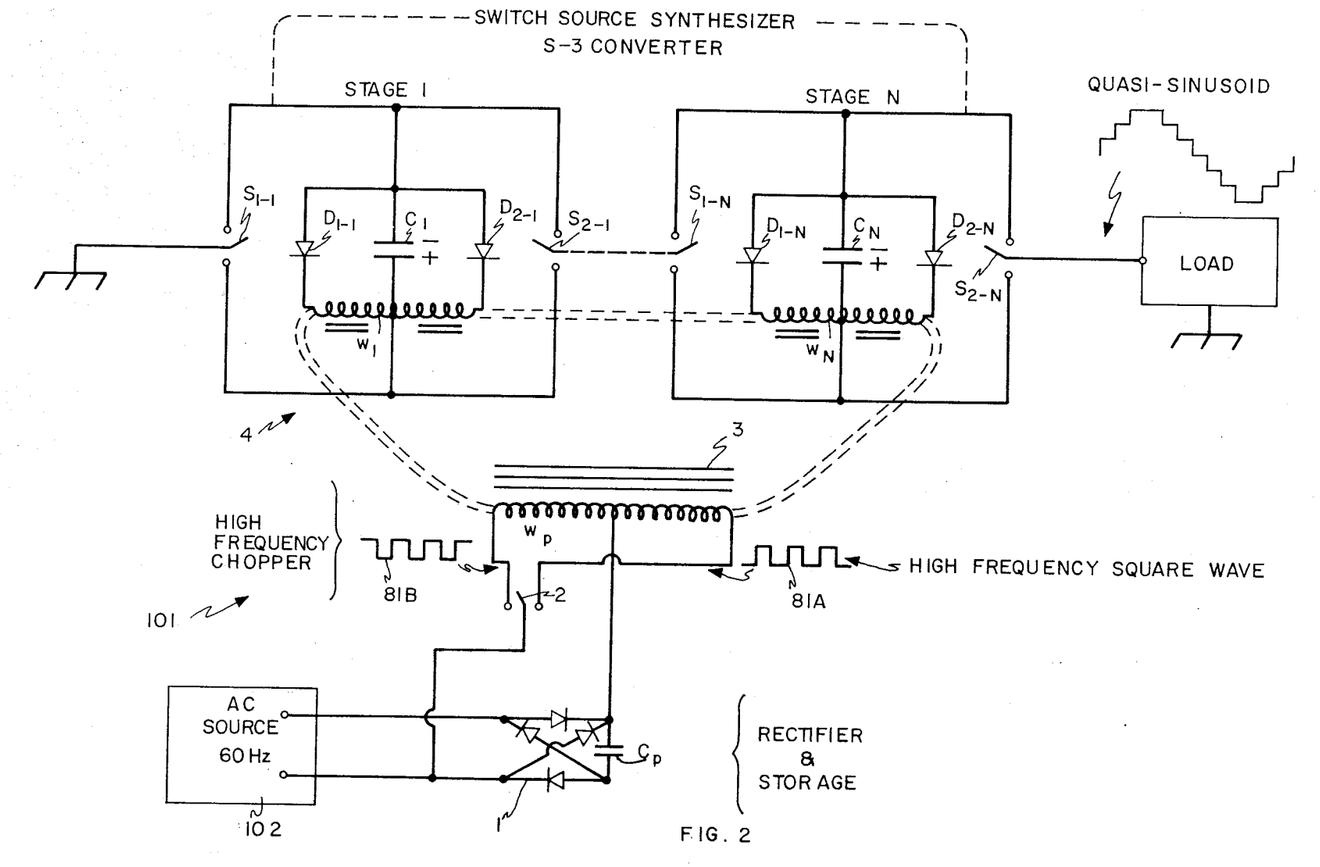
FIG. 2 is a schematic showing in detail one form the system of FIG. 1 can take, the system of FIG. 2 being one that employs a multi-stage output section.

The frequency changer 101 is solid state and is adapted for use in power systems that take up to several kilowatts of power; it includes a source of DC potential that is labeled 1 in FIG. 2 but which includes both elements 1A and 1B in FIG. 1, that are a rectifier and a capacitance, respectively. The rectifier 1A, as shown in FIG. 2, comprises both a plurality of diodes to give full-wave rectification and a storage capacitor $C_P$. The DC output voltage of the source 1 is changed to a series of high-frequency voltage pulses 81A and 81B connected as input to its primary winding $W_P$ to produce as output from its secondary windings $W_1$ and $W_N$ a transformed series of high frequency voltage pulses that are delivered to a switched source synthesizer or S-3 converter 4 that produces the quasi-sinusoid 80. The explanation in the next paragraph is directed mostly to the switched source synthesizer 4 which is shown to comprise N stages, stage 1 . . . stage N: in the diagrammatic representation the secondaries $W_1$ and $W_N$ of the transformer are shown within the respective stages 1 and N, but in what follows the transformer is treated as being outside the stage, as is shown in FIG. 1; that is, for purposes of this explanation, the tranformer 3 is not considered to be part of stages 1 . . . N but is, rather, considered to be part of the chopper means comprising the chopper switch 2 and the transformer 3.

Each stage of the plurality of stages comprises an input, an output, first bilateral switch means $S_{1-1} \ldots S_{1-N}$ and second bilateral switch means $S_{2-1} \ldots S_{2-N}$. As is discussed in said U.S. Pat. No. 3,867,643, the roles of input and output change in the course of generating the quasi-sinusoid 80. Each of the stages 1 . . . N includes supply voltage means which is shown as capacitances $C_1 \ldots C_N$ connected to receive a rectified voltage from diodes $D_{1-1}, D_{2-1} \ldots D_{1-N}, D_{2-N}$ which serve to rectify the output of the secondary windings $W_1 \ldots W_N$, respectively. The first bilateral switch means and the second bilateral switch means act, in combination, such that the input and the output of any particular stage are connected together and therefore at equal potential or the capacitance of the stage is connected between the input and the output of the stage such that the output is positive with respect to the input of the stage or the output is negative with respect to the input of the stage, as conditions of system operation. The switches $S_{1-1}$, etc., can be bilateral solid state switches described in said U.S. Pat. No. 3,748,492 or in some of the other applications noted above, but a particular form of switch is hereinafter discussed.

The frequency changer 101 thereby produces a twelve-step per cycle quasi-sinusoid of high purity and one whose purity is controllable, as explained in said U.S. Pat. No. 3,909,685. The incoming 60 Hz AC from the AC source labeled 102 can be rectified directly without a 60 Hz input transformer. Also, since the DC voltage across the capacitor $C_P$ is chopped at a high frequency, the transformer 3 can be small (the copper-iron product is inversely proportional to frequency over an extended frequency range) and the size of the capacitances of $C_1 \ldots C_N$ can be minimized. The rate at which the switches $S_{1-1}$, etc., are cycled can be changed from a rate of several hundred Hz all the way down to zero. The system can, therefore, generate a low distortion sinewave (or any other desired waveform such as square wave, triangular wave, etc.) over a wide range of frequencies, including DC (zero frequency).

The changer 101 is a flexible one because the three sections (i.e., rectifier and storage 1, chopping switch 2 and transformer 3, and the cascade of stages) can be designed to satisfy independent conditions. For example, the input section 1, can be tailored to different source characteristics without changing the system output, the chopping rate and/or the transformer turns ratio can be varied with, for example, an automatic tap changing system to obtain voltage regulation against both source and load changes, and the output section (i.e., the stages) can be operated at various rates, and with various switch patterns (that is, can be programmed) to generate a multitude of differing waveforms as well as different power levels, etc.

Figure 3:
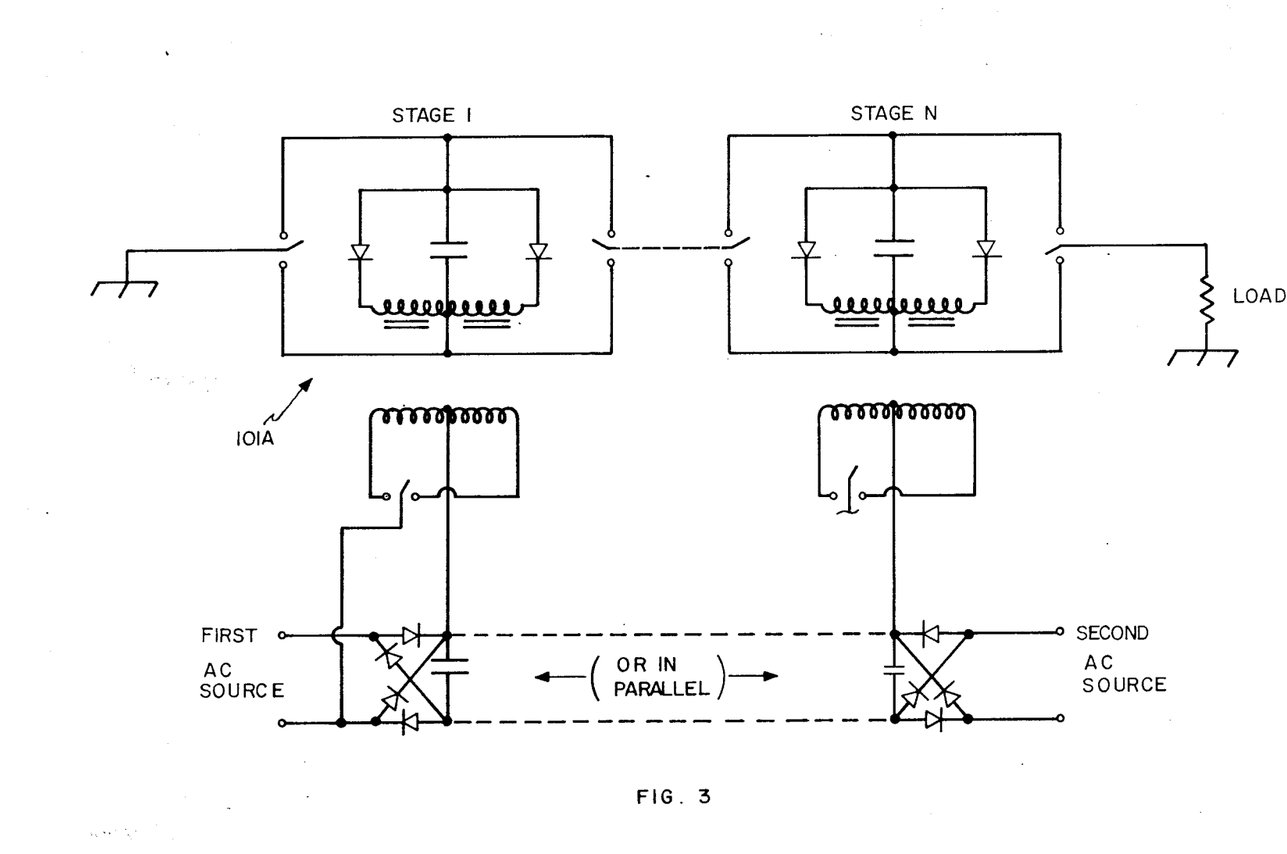
FIGS. 3 and 4 illustrate schematically modifications of the system of FIG. 2.
Figure 4:
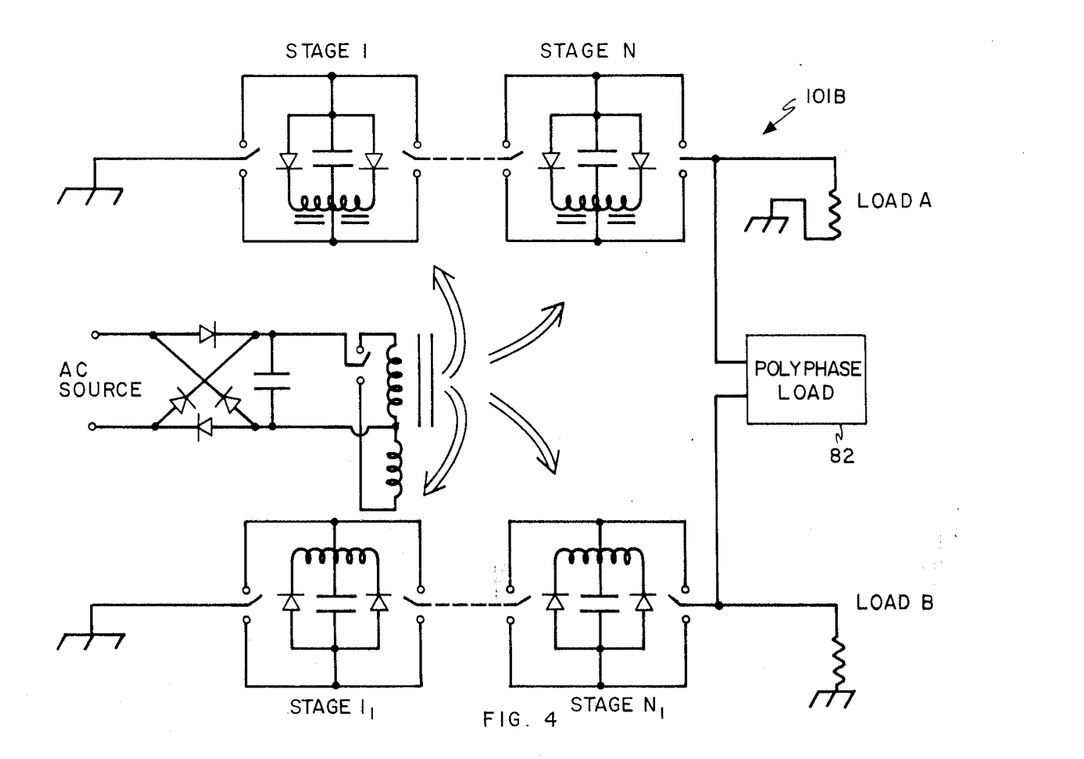

The frequency changer system herein described is modular in that one or more input sections 1 and/or chopper sections can be operated at once as is done in the frequency changer labeled 101A in FIG. 3 which shows a system with two input sections feeding the primaries of two transformers. Also, multiple output sections may be operated from one input section; thus, whereas the frequency changer 101A in FIG. 3 has a plurality of stages 1 ... N connected in cascade in the same way as the changer 101, the changer 101B in FIG. 4 has a plurality of cascades (stages 1 ... N and $1_1$ ... $N_1$) of stages connected as single phase units to power single phase loads A and B independently, or the cascades in FIG. 4 can be connected in a polyphase configuration (here two-phase) to power a polyphase load 82 which can be a rotating machine, for example.

Figure 5:
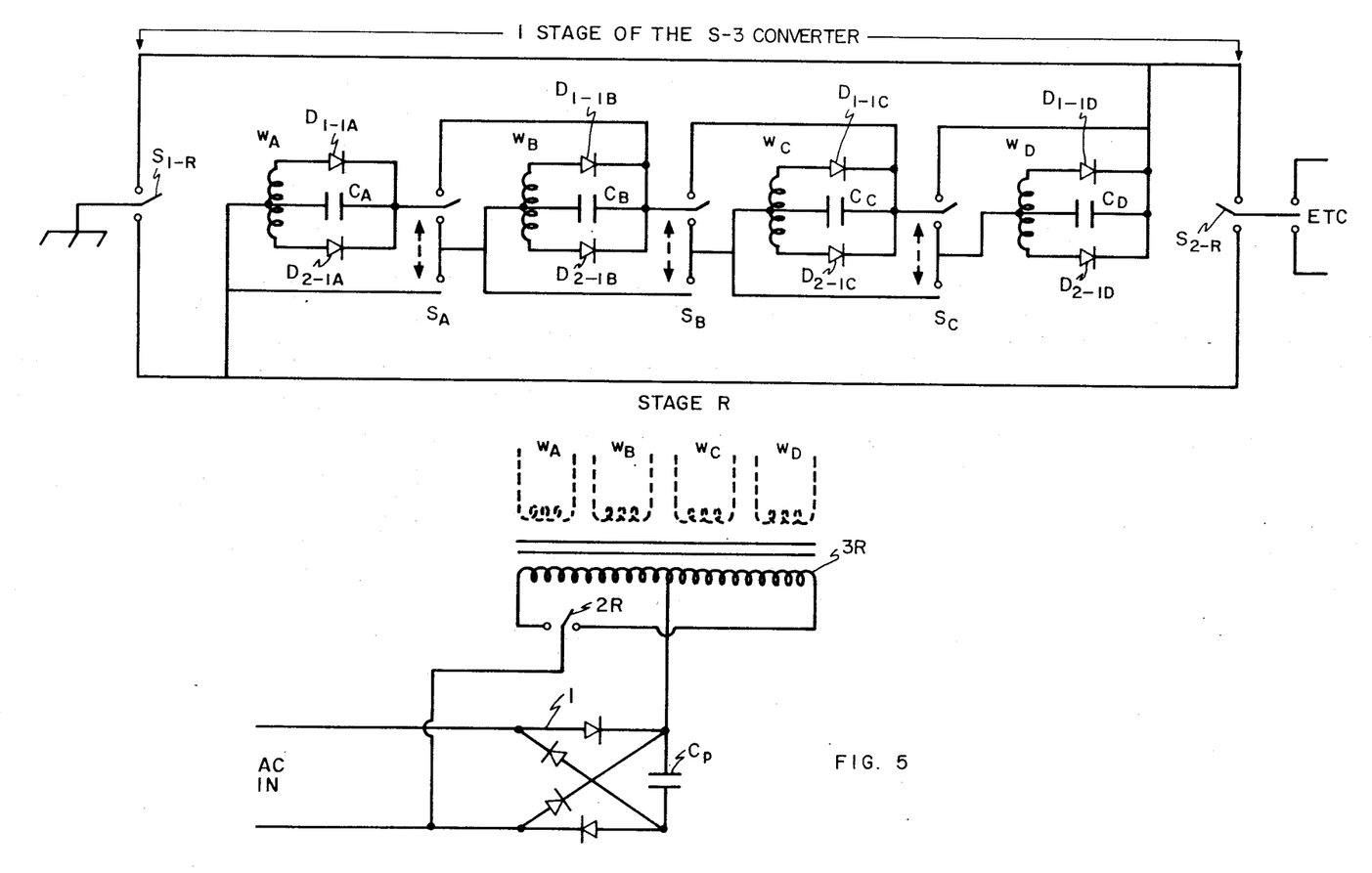
FIG. 5 is a schematic circuit diagram showing a single stage of a multi-stage system of the type shown in FIG. 2, for example, and illustrates a very good arrangement for obtaining variable voltage output from the system.

In the systems described so far, the discussion has been restricted to waveforms of varying frequency, but no mention is made of voltage changes. Any of the stages in the switched source synthesizers shown in FIGS. 1–4 can be replaced by a stage like stage R in FIG. 5 to provide an output waveform 80 that is variable in both frequency and voltage. The broad concept here is discussed in detail in said U.S. Pat No. 3,909,685, but the present system has advantages over the other. In FIG. 5 the input section is again designated 1; the chopper, marked $2_R$, and transformer, marked $3_R$, interact to form an intermediate or chopping section as before, to provide a series of square pulses. Here the transformer has four (it can have two, three, four, or more) secondaries $W_A$, $W_B$, $W_C$ and $W_D$ connected respectively through rectifier sets $D_{1-1A} - D_{2-1A}$, $D_{1-1B} - D_{2-2B}$, $D_{1-1C} - D_{2-1C}$ and $D_{1-1D} - D_{2-1D}$ to energize electric energy elements (e.g., capacitors) $C_A$, $C_B$, $C_C$ and $C_D$.

The stage R is designed to deliver a constant volt-ampere product at a variable frequency (CVA- $\Delta f$); it has storage switches $S_A$, $S_B$, and $S_C$ which interconnect capacitors $C_A$, $C_B$, $C_C$ and $C_D$ so that they may all be connected in parallel or all in series or in some intermediate configuration. Because the four secondary windings $W_A$, $W_B$, $W_C$ and $W_D$ are on the same magnetic core, the total output volt-ampere product output from the windings is constant whether the windings are in parallel or series (for a constant primary excitation). This is important for situations wherein, for example, a synchronous motor must be driven at a variable speed but with a constant input power.

Frequency changers 101, 101A, 101B as shown, with or without the variable voltage feature of FIG. 5, are used basically for high power systems at low voltage as may be employed in industrial systems requiring kilowatts of power that may be varied in frequency and/or voltage at 600 volts or less, usually. In the systems now to be discussed average power requirements, in general, are not large, but voltages are. By way of illustration, the end use may be for x-ray machines, wherein typically an 80,000 volt, several milliseconds pulse is used; or the use may be instrumentation requiring complex voltage waves as discussed in said U.S. Pat. No. 3,748,492. In any event, here the high frequency techniques noted above are employed in energy processing in the high voltage power supply shown at 103A in FIG. 6, as now explained.

The supply 103A includes a source of high frequency electric energy 104 which may be a high frequency motor generator set, for example, but which may be the elements 1, 2 and 3 (here again the transformers in the supply 103A assume the ambivalence discussed above) in FIG. 2 powered from the usual 60 Hz bus. The output of the source 104 is a series of square pulses 81C. A plurality of two-winding transformers $3_1$, $3_2$, $3_3$ ... $3_N$ is connected to receive the high frequency electric energy as input to the primary of each and to provide as output an isolated secondary voltage. Again in FIG. 6 the output section comprises a plurality of stages here marked stage 1A, stage 2A, etc., to show that they are slightly modified from the stages in FIG. 2 in that, among other things, the switches $S_{1-1}$ ... $S_{1-N}$ are not included in FIG. 6.

Figure 6:
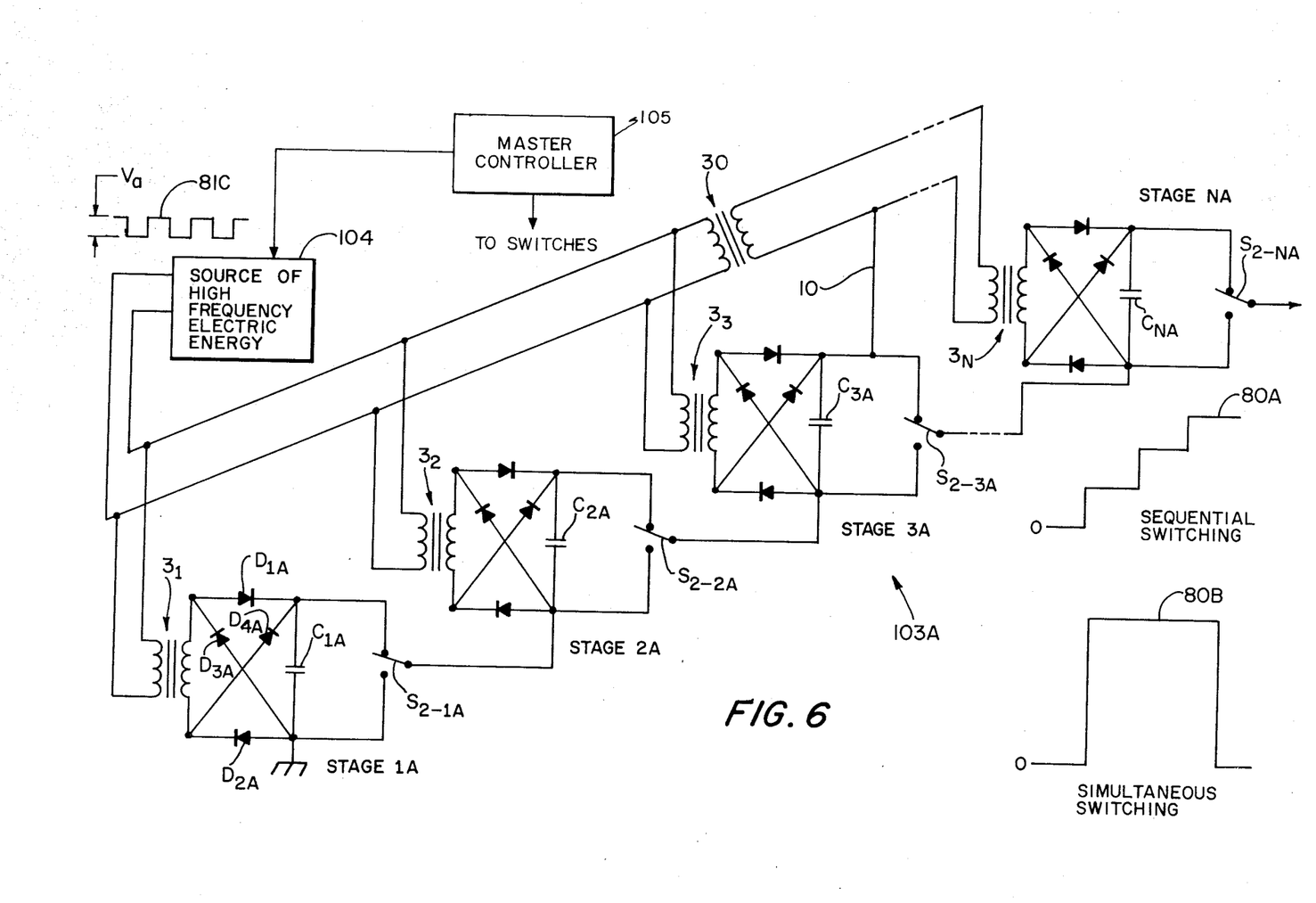
FIG. 6 is a schematic circuit diagram, partly block diagram in form, of a modification of the system of FIG. 1, and shows a system wherein the high frequency processing techniques are employed to give controllable, and very high voltage, output voltages.

The capacitances in the stages are marked $C_{1A}$, $C_{2A}$ ... $C_{NA}$. The full wave rectification in FIG. 6 is a different way of effecting the desired result over that shown in FIG. 2; rectification is accomplished by four diodes of which only diodes $D_{1A}$, $D_{2A}$, $D_{3A}$ and $D_{4A}$ in stage 1A are marked. The switches marked $S_{2-1A}$ ... $S_{2-NA}$ perform a function similar to the switches $S_{2-1}$, etc., being sequenced to give an output voltage at the switch $S_{2-NA}$, that can be a stepped-voltage wave 80A, or a square wave 80B, or some other waveform. The switches $S_{2-1A}$ act to connect one side or the other of a capacitance of one stage to one side of the next stage. Thus, the switch $S_{2-1A}$ of stage 1A connects one side or the other of the capacitance $C_{1A}$ to one side of the capacitance $C_{2A}$, the switch $S_{2-2A}$ of the stage 2A connects one side or the other of the capacitance $C_{2A}$ to one side of the capacitance $C_{3A}$, etc. to stage stage NA.

In the power supply 103A, stages 1A, 2A and 3A at the low voltage end of the power supply 103 are energized by respective transformers $3_1$, $3_2$ and $3_3$ that are connected directly to the source 104. However, the supply includes one or more isolation transformers 30 that feed the stages (e.g., the stage NA) at the high voltage end of the supply. One side of the secondary of an isolation transformer is connected to the high side of the capacitances of the stage just preceding the isolation connection. For example, a lead 10 connects the high side of the capacitance $3_A$ to one side of the secondary of the transformer 30; hence the voltage that must be isolated by the next transformer in the chain (i.e., a transformer $3_4$, not shown) is merely equal to the voltage across the single capacitance $C_{3A}$.

The power at the output of a chain network such as that forming the power supply 103A is the sum of the power generated in each stage. Accordingly, quite large power levels can be attained. An analysis of the system by the present inventor shows that losses in the supply 103A at frequencies of interest is much less than would occur were a single step-up transformer to be used. Further, the arrangement shown allows the use of low voltage components to provide a very high voltage requirement; this has the potential of lowering the cost of the supply 103A dramatically over other proposed solutions. In those situations wherein complex waves are not required, the high voltage supply shown at 103B in FIG. 7 can be employed.

Figure 7:
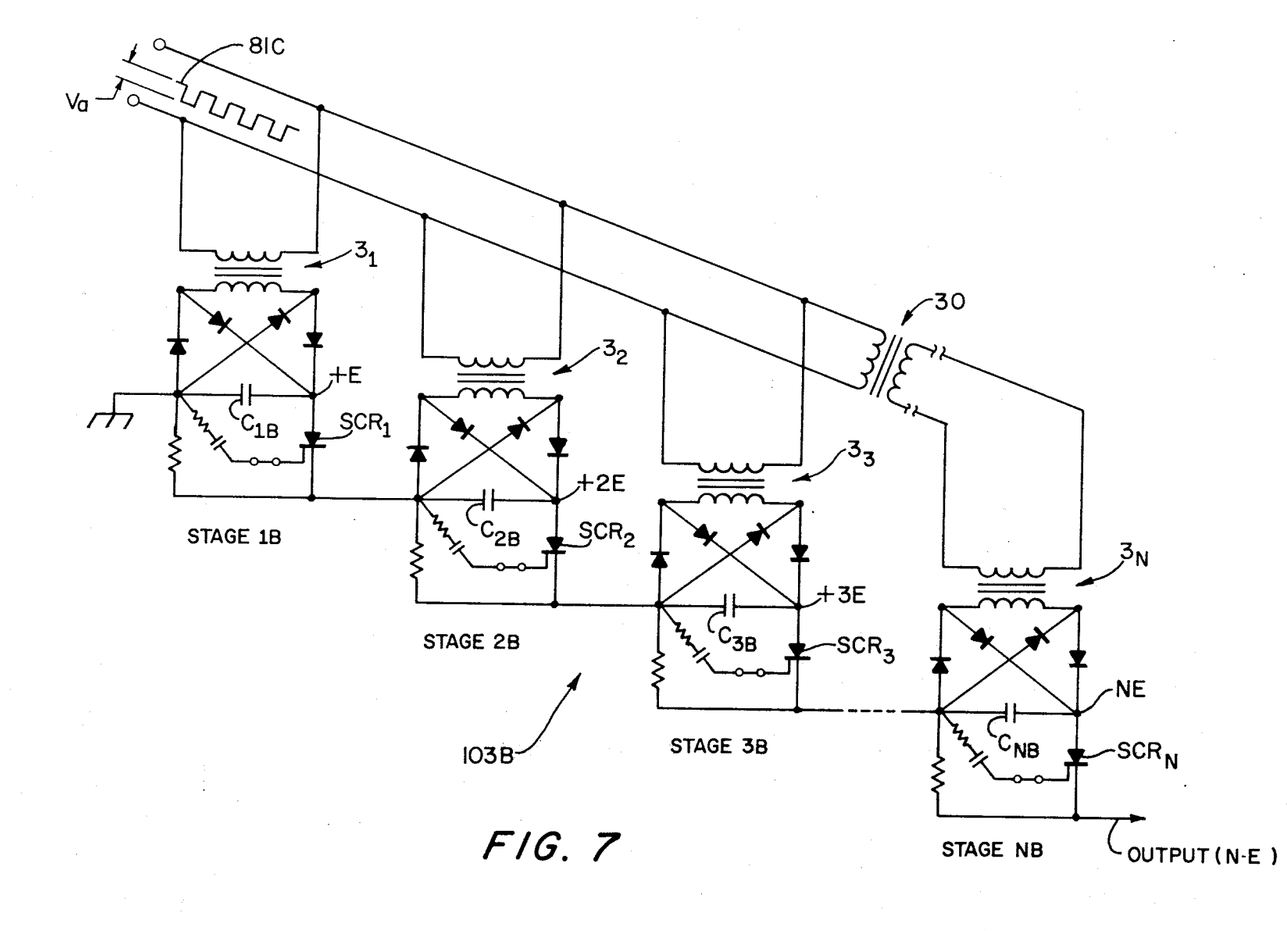
FIGS. 7 and 8 are schematic circuit diagrams of modifications of the system of FIG. 6.

The supply 103B is similar to the supply 103A except that in the former at output pulse from the last stage, here stage NB, which is the sum of the voltages across capacitances $C_{1B}$, $C_{2B}$ ... $C_{NB}$ of stages 1B, 2B ... NB, respectively, is provided by so-call "domino" switching of thyristors as now explained. In the explanation the voltage across each stage capacitance is taken to be E volts, giving a system output of approximately NE volts.

The configuration shown in FIG. 7 provides a low-cost simple method for generating positive-going waveforms with a fast rise time. The high frequency square wave pulse 81C with amplitude $V_a$, as before, is fed to a transmission line structure. The outputs from the low voltage, two-winding transformers again marked $3_1$, $3_2$, etc., are an isolated set of rectified voltages ($E = nV_a$) which are stored on capacitors $C_{1B}$, $C_{2B}$, $C_{3B}$, etc.; switching between stages is accomplished by thyristors $SCR_1$, $SCR_2$, $SCR_3$, etc., respectively. When the thyristor $SCR_1$ is triggered, its anode is pulled from ground to a potential equal to +E volts which lifts the entire network of the second stage by E volts. This causes the thyristor $SCR_2$ to turn ON which lifts it anode by E + E = 2E volts, which fires the thyristor $SCR_3$ which lifts stage 4, etc. At given intervals in the system, a high voltage isolation transformer 30 is used so that subsequent transformers, i.e., . . . 3N can also be low voltage units. A number of other features of the configuration shown in FIG. 7 are noted in the next paragraph.

The network 103B gives a fast rise-time pulse because the energy stored on the capacitor $C_{1B}$ is used to drive the stray capacity (load) on the output of stage 1B, the energy on the capacitor $C_{2B}$ to drive strays of the output of stage 2B, etc. The network can produce a DC output because the energy stored on each capacitance is continuously replenished. If the input voltage pulses 81C are stopped, the voltage of the entire network collapses and each thyristor automatically turns off. The value of the output varies linearly (almost) with the amplitude $V_a$ of the input voltage. Accordingly, by making the supply voltage variable and turning $V_a$ ON and OFF, the network 103B can then be used to produce variable-amplitude, variable-width pulses.

The high voltage power supply marked 103C in FIG. 8 again consists of N identical stages, five such stages being shown in FIG. 8 and labeled stage 1C, stage 2C, stage KC, stage KC + 1 and stage N to simplify this explanation. The input to the network 103C is from a variable voltage high frequency chopper 104C which again provides a train of pulses 81C having pulse height $V_a$, as before; the pulse height, however, is variable and the train of pulses 81C can be started and stopped by the chopper 104C, i.e., the chopper 104C is a gated chopper. Each of the stage capacitances, here capacitances $C_{NC}$ . . . $C_{1n}$, is charged to a voltage E, where again $E = nV_a$, and the network output is a pulse 80C which equals the voltage E of each stage capacitance multiplied by the number of stages, again minus a small voltage due to miscellaneous voltage drops in the system.

Figure 8:
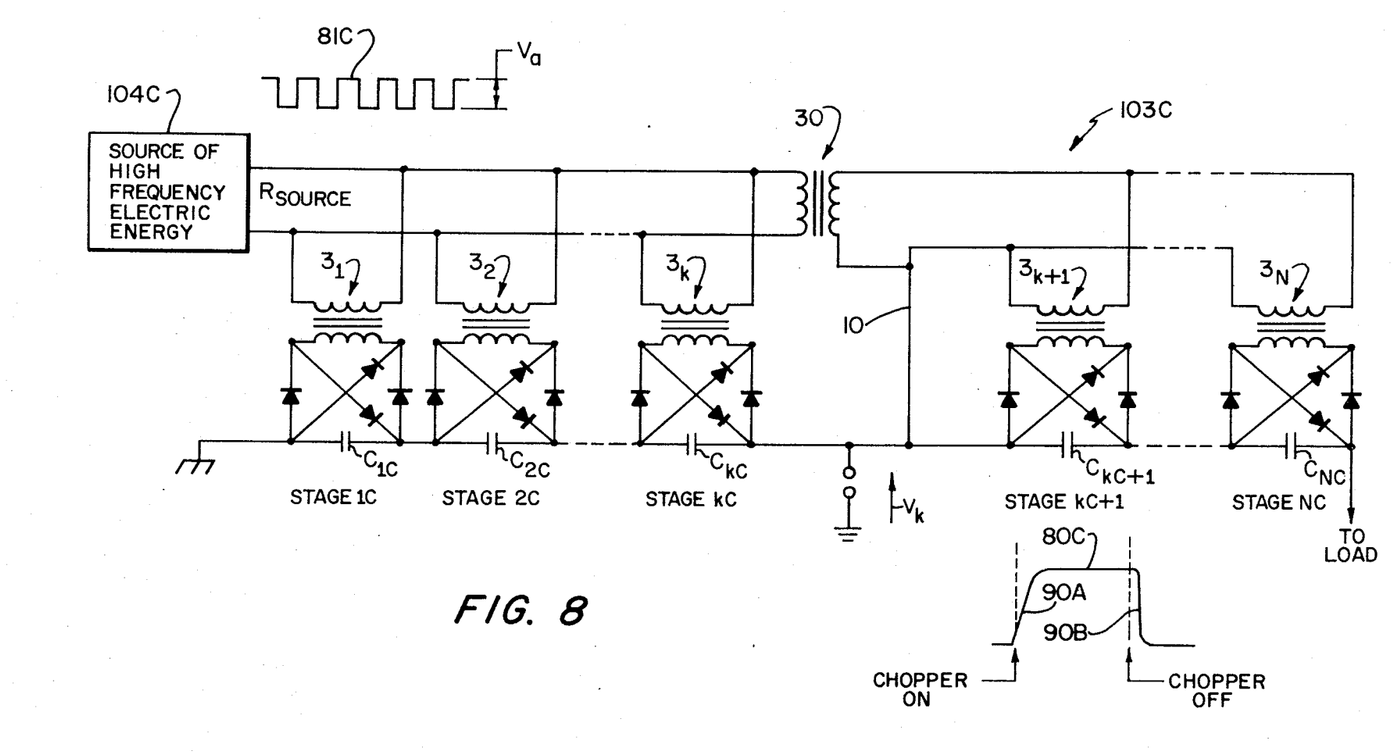

The output pulse 80C has a leading edge 90A and a trailing edge 90B. The rise time of the pulse 80C is a function of the time constant set mostly by the chopper output and the combined capacitances $C_{1C}$, $C_{2C}$, etc. The fall time of the pulse 80C depends of a time constant set by the value of the load resistance and the capacitances values. Isolation is effected by the isolation transformer 30 that has a one-to-one turns ratio as before. The voltage between stage kC and the stage kC + 1 across the transformer 30 is again E volts. The amplitude of the pulse 80C can be varied up and down by varying the voltage $V_a$. The power supply 103C, like the supplies 103A and 103B, can be made using low voltage components.

Figure 9:
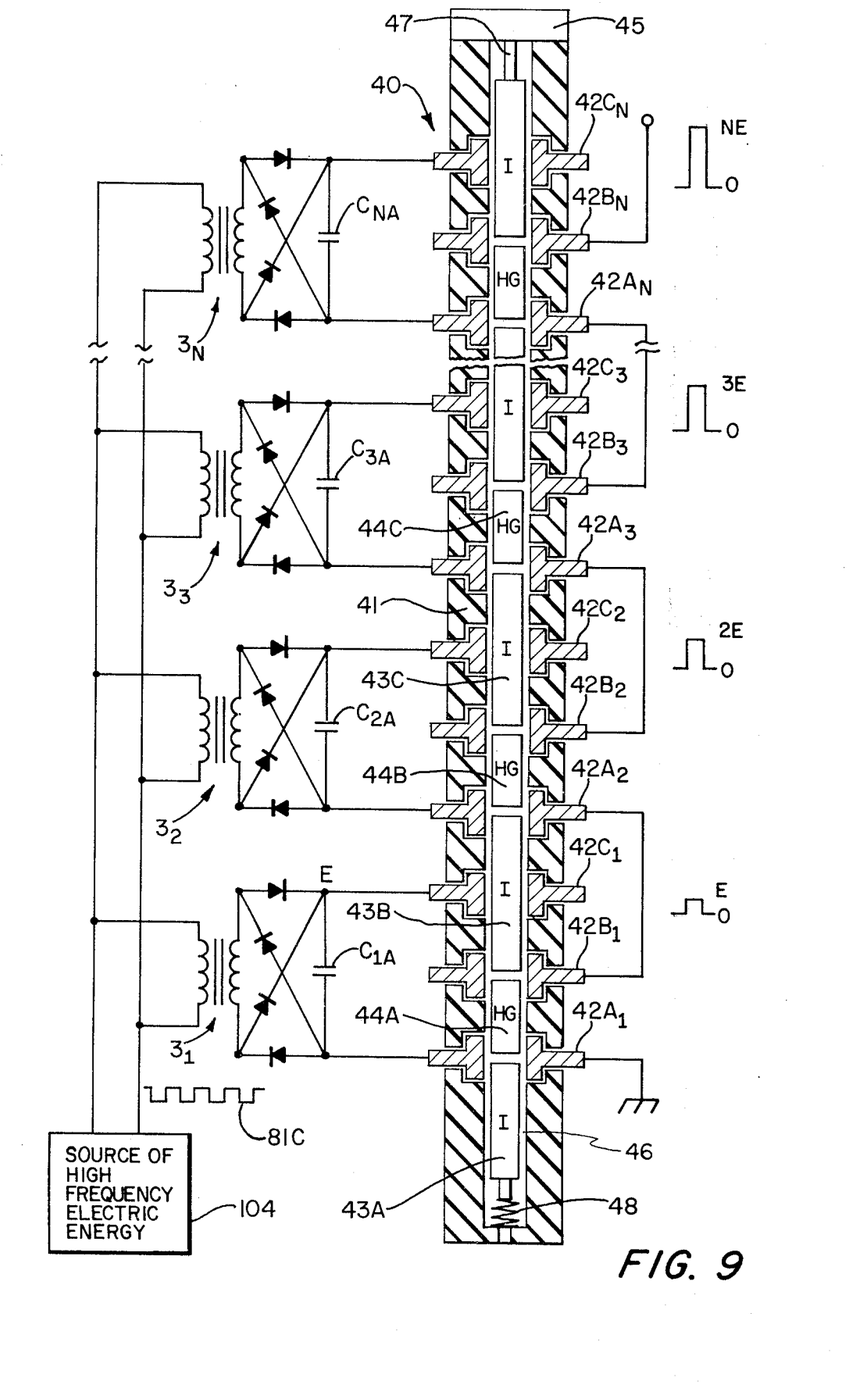
FIG. 9 is a longitudinal section view showing a multicontact switch which typically employs liquid segments separated by insulating segments and wherein the segments move longitudinally to effect the switching function.

The various switches in the figures can be the bilateral switches disclosed in said patents and patent applications; however, a preferred form of switch for the switches $S_{2-1A}$, etc., in FIG. 6 is shown at 40 in FIG. 9.

The switch 40 is a chain switch comprising an elongate chamber 46 having distributed therealong axially spaced electrical contacts formed in three-group sets. The contacts are marked $42A_1$, $42B_1$, and $42C_1$, to indicate the first set which performs the functions of the switch $S_{2-1A}$ in FIG. 6 (i.e., a single-pole, double-throw switch) contacts $42A_2$, $42B_2$, and $42B_3$ to indicate the second set which perform the function of the switch $S_{2-2A}$, and so forth to the Nth stage. Or a plurality of switches like the switch 40 can be used; thus, one such switch could perform the switching function at the lower or low voltage end and another at the high voltage end, with intermediate switches, as needed. The chain switch 40 can be a liquid switch as described in U.S. Pat. No. 3,906,415 (Baker) or a modification thereof. In any event, segments 43A, 43B, etc. (also labeled I) are insulating segments and segments 44A, 44B, etc., are conducting segments; the former can be an insulating liquid, for example, and the latter can be mercury (Hg), as shown. For present purposes, let it be assumed that the segments 43A, 43B, etc., are solid insulators and are activated to move downward by a downward force exerted by a solenoid 45 upon a shaft 47. If the potential across capacitance $C_{1A}$ etc., is E volts, then the stage outputs are E, 2E, etc., as shown.

The electrical contacts $42A_1$ . . . $42C_N$ are preferably ring or annular contacts, as is described in great detail in U.S. Pat. No. 3,906,415, made of tungsten. A pair of contacts of a set (e.g., the contacts $42A_1$ and $42B_1$) is electrically shorted together when the axial gap between adjacent contacts is bridged by a mercury segment (the segment 44A bridges the gap between the contacts $42A_1$ and $42B_1$) and is electrically isolated from one another when at least part of said gap contains an insulating segment (e.g., the contact $42B_1$ and $42C_1$ are isolated from one another by the insulating segment 43B). It will be appreciated in the light of the foregoing explanation, that the conducting and insulating segments must have rather precise lengths to perform the make-break functions herein disclosed in the required manner.

The concepts herein disclosed suggest a number of possibilities in the way of implementing circuitry. Thus, the input to the system of FIG. 4 can be 60 Hz single phase and the output can be AC, single phase or polyphase or DC; but with some circuit changes the input can be polyphase and the output single phase, or polyphase or DC, or the input can be DC with the same system outputs available by appropriate circuitry within the present teaching. In a word, the general concept herein permits circuitry that is flexible — it is also economical.

Sequencing of the various switches herein can be accomplished under the direction of a master controller 105 in FIG. 6. It will be appreciated that such master controller would be used with each embodiment. The timing of the various switching functions, of course, is of critical importance to proper operation of the apparatus disclosed. Such timing is provided by the master controller through appropriate trigger circuitry which can be incorporated in the controller or be separated therefrom. Triggering can be accomplished by flip-flop circuits or other well-known circuitry. The actual controlling or directing functions can be effected by a microprocessor that includes (as is well known to workers in this art) a clock, flip-flop, gates and other assorted circuitry interconnected to perform standard data processing functions such as, for example, signal missing, time sequence generation, code selection, etc.: see for example, basic logic circuits in the text, "Analog-to-Digital/Digital-to-Analog Conversion Techniques," (David F. Hoeschele, Jr., John Wiley & Sons, Inc., 1968); "Digital Computer Fundamentals" (Thomas C. Bartel, McGraw-Hill Book Company, Inc., 1960); and many articles in trade journals, for example, Electronics, Nov. 8, 1973 and other issues. Controller functions can be attained by using standard microcompressor units readily available in chip form from many manufacturers.

Further modifications of the invention herein disclosed will occur to persons skilled in the art and all such modifications are deemed to be within the spirit and scope of the invention as defined by the appended claims.

What is claimed is:

1. A frequency changer for power systems that comprises, in combination:
   a source of DC potential;
   means for changing the DC output voltage of said source to a series of high-frequency voltage pulses;
   a transformer connected to receive the series of high-frequency voltage pulses as input to the primary winding thereof and to produce as output from the secondary winding thereof a transformed series of high-frequency voltage pulses; and
   an electric stage having an input and an output, first bilateral switch means and second bilateral switch means, said electric stage further including rectifying means connected to receive the output from the transformer secondary and operable to rectify the same, said electric stage further including supply voltage means connected to receive and store the rectified voltage, the first bilateral switch means and the second bilateral switch means acting in combination such that the input and the output of the electric stage are connected together and therefore at equal potential or such that the supply voltage means is connected between the input and the otput of the stage such that the output of the stage is positive with respect to the input of the stage or the output is negative with respect to the input of the stage as conditions of system operation.

2. A frequency changer as claimed in claim 1 in which the transformer comprises a plurality of secondary windings and which includes a plurality of electric stages, each electric stage having an input, an output, first bilateral switch means and second bilateral switch means, each stage further including rectifying means connected to receive the output from one of the secondary windings of the transformer and operable to rectify the same, each said electric stage further including supply voltage means connected to receive and store the rectified voltage, the first bilateral switch means and the second bilateral switch means of each electric stage acting in combination such that the input and the output of the electric stage are connected together and therefore at equal potential or such that the supply voltage means of the electric stage is connected between the input and the output of the stage such that the output of the stage is positive with respect to the input of the stage or the output of the stage is negative with respect to the input thereof as conditions of system operation.

3. A frequency changer as claimed in claim 2 in which the plurality of stages is connected in cascade.

4. A frequency changer as claimed in claim 3 in which the plurality of stages is further connected in a polyphase configuration wherein each phase of the polyphase configuration comprises one or more stages connected in cascade.

5. A frequency changer as claimed in claim 2 in which the plurality of stages is connected in a polyphase electrical configuration.

6. A frequency changer as claimed in claim 1 comprising a plurality of transformers and which includes a plurality of stages as claimed in claim 1, the rectifying means of each stage of the plurality of stages being connected to receive the output from the transformer secondary of one of the transformers.

7. A frequency changer as claimed in claim 6 in which the plurality of stages is connected in cascade.

8. A frequency changer as claimed in claim 7 in which the plurality of stages is further connected in a polyphase configuration wherein each phase of the polyphase configuration comprises one or more stages connected in cascade.

9. A frequency changer as claimed in claim 6 in which the plurality of stages is connected in a polyphase electrical configuration.

10. A frequency changer as claimed in claim 1 in which the means for changing the DC output voltage comprises chopper means.

11. A frequency changer comprising a plurality of stages as claimed in claim 1 and in which at least one stage of the plurality of stages comprises supply voltage means composed of a plurality of electric energy storage elements and a plurality of rectifier sets, in which the transformer connected to feed the electric energy storage elements has a single primary winding and a plurality of secondary windings, each secondary winding being connected through a rectifier set to energize one element of the plurality of electric energy storage elements, and storage switch means which interconnects the plurality of electric energy storage elements all in parallel or all in series or in some intermediate configuration to change the voltage output of said at least one stage without the need to change the excitation of said primary winding.

12. A frequency changer as claimed in claim 11 wherein the electric energy storage elements are capacitors.

13. A high voltage power supply that comprises, in combination: a source of high frequency electric energy; a plurality of transformers connected to receive the high frequency electric energy as input to the primary of each; rectifier means connected to receive the output from the secondary of each transformer and operable to rectify the same; a plurality of capacitances, each capacitance connected to receive as input one rectified output from the secondary of a transformer, said capacitances being connected in cascade such that the voltages in the cascade of capacitances add to give a power supply output that is the sum of the individual potentials of the capacitances of the cascade to produce a high voltage output from the power supply in a modular fashion; and one or more two-winding isolation transformers connected between the output of the source of high frequency electric energy and capacitances at the high-voltage end of the power supply, capacitances at the low voltage end of the power supply being energized by transformers of said plurality of transformers that are connected directly to the output of the source of high frequency electric energy and capacitances at the high voltage end thereof being energized by transformers connected to the secondary of an isolation transformer of said one or more isolation transformers.

14. A high voltage power supply as claimed in claim 13 in which the frequency of the electric energy output of the source is at least 400 Hz.

15. A high voltage power supply as claimed in claim 13 in which the source of high frequency electric energy is gated source means.

16. A high voltage power supply as claimed in claim 15 wherein the gated source means is operable to provide a variable amplitude voltage.

17. A high voltage power supply as claimed in claim 11 that further includes switch means between adjacent capacitances of the cascade of capacitances, said switch means acting to connect one side or the other of each capacitance to one side of the next capacitance of the cascade, thereby to combine the capacitances to provide said high voltage output as a square wave or as a stepped-voltage wave as needed.

18. A high voltage power supply as claimed in claim 17 that includes control means to control the switch means.

19. A high voltage power supply as claimed in claim 17 in which the source of high frequency electric energy is gated source means.

20. A high voltage power supply as claimed in claim 19 in which the gated source means is operable to provide variable amplitude voltage.

21. A high voltage power supply as claimed in claim 17 in which the switch means comprises a thyristor between adjacent capacitances of the cascade of capacitances, the thyristors being controlled such that they are triggered in a domino mode.

22. A high voltage power supply as claimed in claim 13 in which the transformer means comprises a plurality of transformers, each transformer of the plurality of transformers having a primary winding and a secondary winding each of which secondary winding is connected to energize one capacitance of the plurality of capacitances.

23. A high voltage power supply as claimed in claim 13 in which the frequency of the electric energy output of the source is ~ 1000 Hz.

24. A high voltage power supply that comprises, in combination: a source of high frequency electric energy; a plurality of transformers connected to receive the high frequency electric energy as input to the primary of each; rectifier means connected to receive the output from the secondary of each transformer and operable to rectify the same; a plurality of capacitances, each capacitance connected to receive as input one rectified output from the secondary of a transformer, said capacitances being connected in cascade such that the voltages in the cascade of capacitances add to give a power supply output that is the sum of the individual potentials of the capacitances of the cascade to produce a high voltage output from the power supply in a modular fashion; and switch means operable to interconnect said capacitances, the switch means being a chain switch comprising an elongate chamber having distributed therealong axially spaced electrical contacts formed in a plurality of three-groups sets, the chamber being filled with segments of a conducting material separated by segments of a non-conducting material, the segments being displaceable axially along the chamber, a pair of adjacent contacts of a set being shorted together when the axial gap between adjacent contacts is bridged by a conductive segment and being electrically isolated from one another when at least part of said gap contains an insulating segment, the segments within the chamber and the three-group sets of contacts having a geometry such that each set, together with associated segments, forms a single-pole, double-throw switch, the plurality of sets and associated segments acting in concert to form a chain switch that serves to interconnect the capacitances in the cascade.

25. A high voltage power supply as claimed in claim 24 that includes actuator means operable to displace the conducting material segments and the insulating material segments axially along the chamber as a unit in which all segments move in one direction simultaneously.

26. A power supply operable to process high frequency electric energy that comprises, in combination: transformer means connected to receive the high frequency electric energy as input to the primary side thereof and to provide a plurality of secondary outputs; rectifier means connected to receive the secondary outputs and operable to rectify the same; a plurality of capacitances, each capacitance connected to receive as input one rectified output from the secondary of the transformer means, said capacitances being connected in cascade such that the voltage in the cascade of capacitances add to give a power supply output that is the sum of the individual potentials of the cascade of capacitances to produce a voltage output from the power supply in a modular configuration; said transformer means comprising a plurality of transformers, some connected to introduce electric energy to capacitances at the low voltage end of the power supply and others connected to introduce electric energy to capacitances at the high voltage end of the power supply; and isolating two-winding transformer means connected to electrically isolate the transformers at the low voltage end of the power supply from the transformers at the high voltage end thereof.

27. A power supply as claimed in claim 26 in which the frequency of the electric energy is greater than 400 Hz.

28. A power supply for electric power systems that comprises, in combination: a source of DC potential; gated chopper means for changing the DC output voltage of said source to a series of high frequency pulses; transformer means connected to receive the high frequency pulses as input to the primary thereof and to provide a secondary output; and an electric stage having an input and an output, first bilateral switch means and second bilateral switch means, said electric stage further including rectifying means connected to receive the output from the transformer secondary and operable to rectify the same, said electric stage further including supply voltage means connected to receive and store the rectified voltage, the first bilateral switch means and the second bilateral switch means acting in combination such that the input and the output of the electric stage are connected together and therefore at equal potential or such that the supply voltage means is connected between the input and the output of the stage such that the output of the stage is positive with respect to the input of the stage or the output is negative with respect to the input of the stage as conditions of system operation.

29. A electric power supply for power systems that comprises, in combination: a source of DC potential; gated chopper means connected to receive the output of the source and operable to provide a series of high frequency pulses, transformer means connected to receive the high frequency pulses as input to the primary thereof and to provide a plurality of secondary outputs; rectifier means connected to receive the secondary output and operable to rectify the same; a plurality of capacitances, each capacitance connected to receive as input one rectified output from the secondary of the transformer means; and bilateral switch means interconnecting said capacitances to give a power supply output; said power supply being operable to provide variable voltage and/or variable frequency electric energy at kilowatt power; levels in the form of quasi-sinusoidal waveforms.

30. A high voltage power supply that comprises, in combination: a source of high frequency electric energy; a plurality of transformers connected to receive the high frequency electric energy as input at the primary of each and to produce a stepped-up output from the secondary winding thereof; a plurality of electric stages, each stage comprising capacitance means, rectifier means and switch means, the rectifier means being connected to receive the output from the secondary of one transformer of the plurality of transformers, to rectify the same and to feed the rectified energy to the capacitance means of the stage; and isolating, two-winding transformer means connected between the source of high frequency electric energy and stages at the high voltage end of the power supply, the stages at the low end of the power supply being energized directly from the source of high frequency electric energy and stages at the high voltage end being energized through the isolating two-winding transformer means, thereby to effect electrical isolation of the low voltage stages from the high voltage stages.

31. A high voltage power supply as claimed in claim 30 wherein the switch means comprises thyristors connected to switch in a domino mode and wherein the capacitance means of each stage drives stray capacitance of each stage.

* * * * *